United States Patent

Mullins et al.

[11] Patent Number: 4,838,475
[45] Date of Patent: Jun. 13, 1989

[54] METHOD AND APPARATUS FOR EMI/RFI SHIELDING AN INFRARED ENERGY REFLOW SOLDERED DEVICE

[75] Inventors: Aaron B. Mullins, Hurst; Michael H. Bartlett, Fort Worth, both of Tex.

[73] Assignee: Motorola, Inc., Schaumburg, Ill.

[21] Appl. No.: 91,150

[22] Filed: Aug. 28, 1987

[51] Int. Cl.⁴ .................... B23K 31/02; H05K 9/00
[52] U.S. Cl. .................... 228/179; 228/180.2; 228/201; 228/242; 29/840; 29/841; 219/10.55 D; 219/85.13; 361/424; 174/35 TS
[58] Field of Search .......... 228/123, 179, 180.2, 228/201, 242; 29/840, 841, 855, 828; 219/85 BA, 85 BM, 10.55 A, 10.55 D; 174/35 TS; 361/424

[56] References Cited

U.S. PATENT DOCUMENTS

| | | | |
|---|---|---|---|
| 2,570,440 | 10/1951 | Frieberg | 361/424 |
| 3,020,635 | 2/1962 | Redgrift | 228/201 |
| 4,144,404 | 3/1979 | De Groef et al. | 29/828 |
| 4,370,515 | 1/1983 | Donaldson | 361/424 |
| 4,621,180 | 11/1986 | Kristof et al. | 219/10.55 D |
| 4,631,641 | 12/1986 | Brombal et al. | 361/424 |
| 4,722,471 | 2/1988 | Gray et al. | 228/56.3 |

Primary Examiner—Nicholas P. Godici
Assistant Examiner—Samuel M. Heinrich
Attorney, Agent, or Firm—Steven G. Parmelee

[57] ABSTRACT

An EMI/RFI shield (10) comprises a box like structure formed of a metal integral member having a plurality of apertures (16) formed therethrough. The apertures (16) are of a size appropriate to substantially pass infrared energy (22) and to substantially block EMI/RFI energy (26). When placed on a substrate (18), infrared energy (22) can be utilized to reflow solder a device (19) encapsulated by the shield (10) to the substrate (18).

5 Claims, 2 Drawing Sheets

METHOD AND APPARATUS FOR EMI/RFI SHIELDING AN INFRARED ENERGY REFLOW SOLDERED DEVICE

TECHNICAL FIELD

This invention relates generally to EMI/RFI shielding and reflow soldering techniques that use infrared energy.

BACKGROUND ART

In many electrical circuit applications, such as those used in radio transmitters, certain components must often be shielded from EMI and RFI energy that would otherwise detract from their performance or that would escape from such components and interfere with the proper operation of surrounding components. Ordinarily, such shielding is accomplished through provision of a grounded metal barrier. Where appropriate, this can and has included the provision of metal boxes comprised of two or more pieces (including the walls and top) that are positioned around the components to shield it and prevent EMI/RFI energy from passing through such barrier.

In general, such shields must be located on the circuit board substrate after the components themselves have been connected to the substrate, such as through reflow soldering. This is because reflow soldering techniques can not create a satisfactory bond between the components and the substrate when the components are surrounded by such a shield. Subsequent mounting of such shields, of course, represents additional processing time and cost, and a need exists for a way to provide adequate EMI/RFI shielding while simultaneously remaining compatible with reflow soldering techniques.

SUMMARY OF THE INVENTION

These and other needs are substantially met through provision of the invention disclosed herein. This invention comprises a method and apparatus for providing effective EMI/RFI shielding while simultaneously remaining compatible with infrared energy reflow soldering techniques.

The EMI/RFI shield itself is comprised of a box that includes walls and a top. This box, when mounted on a printed circuit board substrate, substantially encapsulates the device in question The walls and top of the box include apertures formed therethrough. The size of the apertures are selected such that infrared energy may pass substantially freely therethrough, while simultaneously remaining substantially opaque to EMI/RFI energy. The apertures also give cleaning fluids and/or vapors access to the substrate and device within the shield to allow flux residue and solder balls to be removed following the soldering process.

As a result, a device can be positioned on a substrate, and the EMI/RFI shield can be mounted on the substrate to encapsulate the device as described. The structure can then be exposed to infrared energy, such that the energy will substantially pass through the shield to thereby cause the device contained therein to be reflow soldered to the substrate. In addition, or in the alternative, energy can be transmitted to the device via the substrate itself If desired, the shield may also be reflow soldered to the substrate at this time as well. Following the reflow process, flux residue and other debris can be removed by passing cleaning fluids in and out of the apertures in the shield.

Through use of this method and apparatus, an effective EMI/RFI shield can be provided that does not require subsequent processing as required by the prior art techniques.

BRIEF DESCRIPTION OF THE DRAWINGS

These and other attributes of the invention will become more clear upon making a thorough review and study of the following description of the best mode for carrying out the invention, particularly when reviewed in conjunction with the drawings, wherein.

BEST MODE FOR CARRYING OUT THE INVENTION

Figure 1:
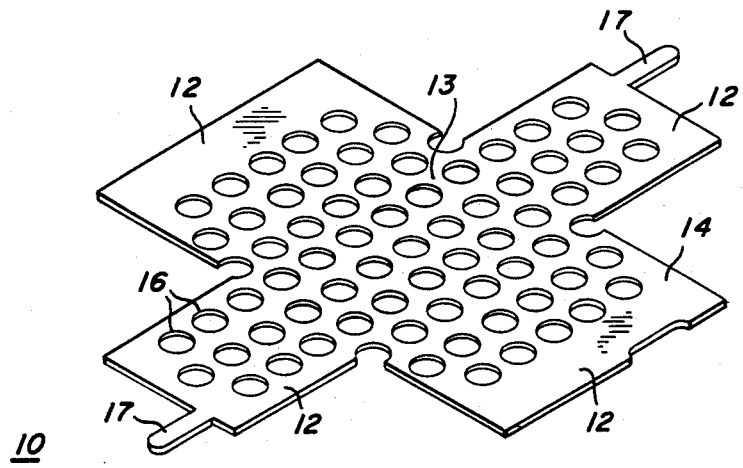
FIG. 1 comprises a perspective view of the shield prior to formation of the box structure.
Figure 2:
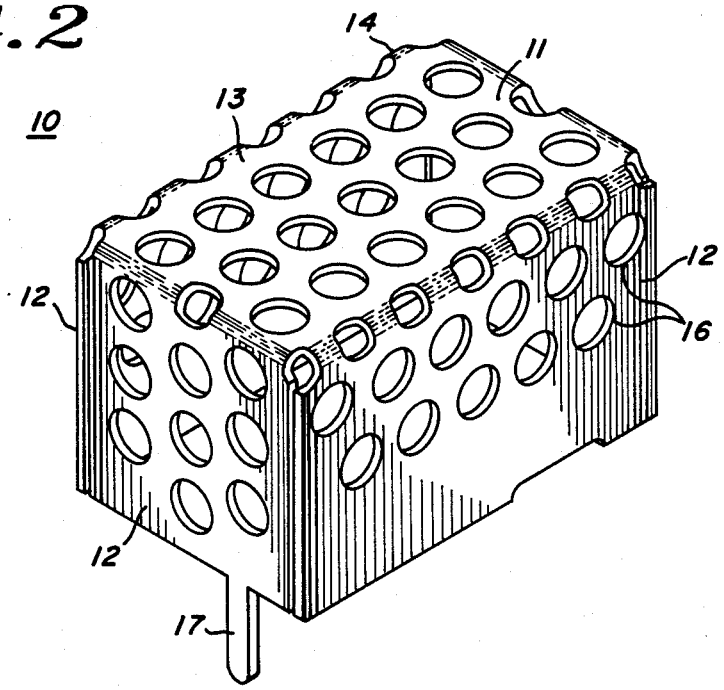
FIG. 2 comprises a perspective view of the shield as formed in a box shape.

Referring now to the drawings, and in particular to FIG. 2, the EMI/RFI shield of the invention can be seen as generally depicted by the numeral 10. The shield (10) can be comprised of a box (11) having walls (12) and a top (13) that can be comprised of an integral metal member (14). With reference to FIG. 1, the walls (12) and the top (13) can be initially comprised of a planar member, which is subsequently bent to form the box (11) depicted in FIG. 2.

In addition, a plurality of apertures (16) can be formed through the walls (I2) and the top (13) of the box (14), which apertures are of a size to substantially allow infrared energy to pass therethrough and to substantially block EMI/RFI energy. For example, if the holes are substantially 1.98 millimeters in diameter, infrared energy will substantially pass through such apertures but frequencies less than 1 gigahertz (which should substantially include most relevant EMI/RFI energy interference) will be substantially blocked.

Also, mounting tabs (17) can be provided to facilitate positioning and mounting of the shield (10) on a substrate.

Figure 3:
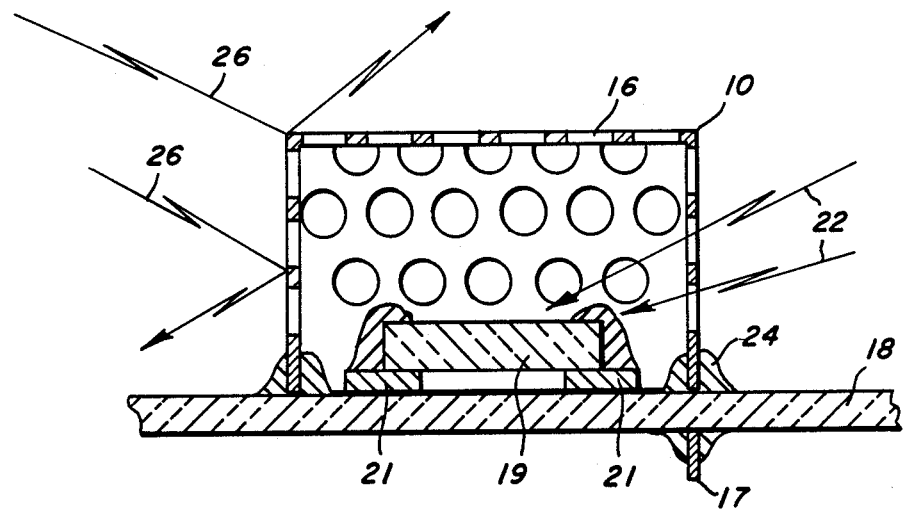
FIG. 3 comprises a detailed partially sectioned front elevational view of the shield as mounted on a substrate and with a device encapsulated therein.

Referring now to FIG. 3, the shield (10) can be seen as mounted on a printed circuit board substrate (18) in accordance with well understood prior art technique. Also position on the substrate (18) can be seen a device (19), which device (19) is substantially encapsulated by the shield (10) and the substrate (18). The device (19) can be positioned, for example, on conductor pads (21) in accordance with well understood prior art technique. Through appropriate initial application of solder paste, also in accordance with well understood prior art technique, the assembled structure can then be exposed to infrared energy (22), which energy substantially freely enters through the apertures (16) and causes the solder paste to melt and thereby cause the device (19) to become soldered in place. At the same time, if desired, solder paste can also be used in conjunction with the shield (10), which solder paste (24) will also melt upon exposure to the infrared energy (22), and thereby also cause the shield (10) to become soldered in place on the substrate (18).

So implaced, it can be seen that EMI/RFI energy (26) will be substantially blocked from passing through the shield (10).

Figure 4:
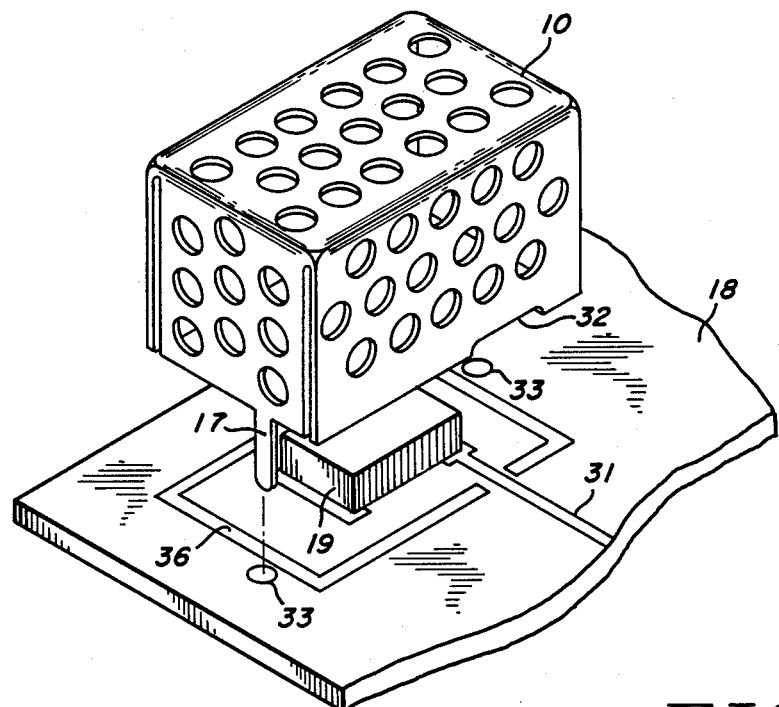
FIG. 4 comprises a detailed perspective view of the shield prior to mounting the shield on the substrate.

With reference to FIG. 4, an alternative embodiment can be seen wherein the substrate (18) has one or more conductor paths (31) disposed on the surface thereof. To accommodate such surface features on the substrate (18), the shield (10) can have notches (32) formed thereon to avoid contact between the shield (10) and the surface features (31) when the shield (10) is mounted on the substrate (18).

Also as can be seen in FIG. 4, holes (33) can be provided through the substrate (18) to accommodate the mounting tabs (17) on the shield (10) to thereby facilitate both proper positioning and mounting of the shield (10) on the substrate (18). Also visible in FIG. 4 is a conductor path (36) that can be juxtaposed against the shield (10) to provide a suitable basis for a soldered bond of the shield (10) to the substrate (18).

Those skilled in the art will appreciate that various modifications and variations of the invention as described could be made without departing from the spirit and scope of the invention. It should be therefore understood that the claims are not to be considered as including the specific limitations of the embodiment set forth in the absence of express limitations directed to such specific features.

We claim:

1. A method of reflow soldering a device to a substrate with infrared energy, the method comprising:
    (A) positioning said device on said substrate;
    (B) positioning an EMI/RFI shield on said substrate and about said device to thereby substantially encapsulate said device, wherein said EMI/RFI shield comprises a box having apertures formed therethrough, which apertures are of a size to substantially allow infrared energy to pass therethrough and to substantially block EMI/RFI energy;
    (C) exposing said EMI/RFI shield to infrared energy, such that said infrared energy substantially passes through said EMI/RFI shield to cause said device to be reflow soldered to said substrate.

2. The method of claim 1 wherein, in step C, exposure of said EMI/RFI shield to said infrared energy also causes said shield to be reflow soldered to said substrate.

3. The method of claim 1 comprising the additional step of
    (A) positioning said device on said substrate;
    (B) positioning an EMI/RFI shield on said substrate and about said device to thereby substantially encapsulate said device, wherein said EMI/RFI shield has apertures formed therethrough that are substantially opaque to EMI/RFI energy;
    (C) exposing said device and shield to energy, such that said device and said shield are soldered to said substrate;
    (D) exposing, through said apertures in said EMI/RFI shield, said substrate that is proximal to said device to a cleaning substance to allow flux residue to be removed therefrom.

4. The method of claim 1 wherein said substrate includes at least one surface feature, and said EMI/RFI shield includes at least one notch, and wherein said step of positioning the EMI/RFI shield on the substrate includes the step of positioning the EMI/RFI shield such that the notch accommodates the surface feature on the substrate.

5. The method of claim 1 wherein the EMI/RFI shield includes at least one mounting tab and the substrate includes at least one mounting tab reception hole, and wherein the step of positioning the EMI/RFI shield on the substrate includes the step of positioning the mounting tab within the mounting tab reception hole.

* * * * *